(12) United States Patent
Kirn

(10) Patent No.: US 6,636,113 B1
(45) Date of Patent: Oct. 21, 2003

(54) LOAD COMPENSATION TECHNIQUE FOR REACTIVE IMPEDANCE TRANSFORMATION AMPLIFIER OUTPUT STAGE

(76) Inventor: Larry Kirn, 7158 Valleybrook, West Bloomfield, MI (US) 48322

(*) Notice: Subject to any disclaimer, the term of this patent is extended or adjusted under 35 U.S.C. 154(b) by 0 days.

(21) Appl. No.: 09/980,983

(22) PCT Filed: May 19, 2000

(86) PCT No.: PCT/US00/13852

§ 371 (c)(1),
(2), (4) Date: Nov. 15, 2001

(87) PCT Pub. No.: WO00/70753

PCT Pub. Date: Nov. 23, 2000

Related U.S. Application Data

(60) Provisional application No. 60/134,817, filed on May 19, 1999, and provisional application No. 60/174,399, filed on Jan. 5, 2000.

(51) Int. Cl.[7] .................................................. H03F 3/38
(52) U.S. Cl. ........................... 330/10; 330/207; 330/251
(58) Field of Search .......................... 330/10, 207, 251, 330/207 A

(56) References Cited

U.S. PATENT DOCUMENTS 4,187,467 A * 2/1980 Cummings .................. 455/115
4,334,254 A * 6/1982 Baker et al. .................... 361/9
5,610,553 A   3/1997 Kirn ............................. 330/10
5,612,646 A * 3/1997 Berning ........................ 330/10
5,925,998 A * 7/1999 Olson ........................... 318/484
5,949,282 A * 9/1999 Nguyen et al. ................ 330/10
6,040,676 A * 3/2000 Nordquist et al. ........... 318/696

* cited by examiner

Primary Examiner—Michael Tokar
Assistant Examiner—Linh Van Nguyen
(74) Attorney, Agent, or Firm—Gifford, Krass, Groh, Sprinkle, Anderson & Citkowski, PC

(57) ABSTRACT

A method of selectively reducing the impedance presented to the load of a reactive impedance transformation amplifier output stage reduces distortion caused by load reactance. A control circuit is interconnected to a gated switch on at least one side of the load, and the switch is controlled to shunt back-EMF from the load. In one embodiment, the shunting action is initiated when the released energy would approach zero with a purely resistive load. Since the delay time may be a function of energy released, the delay from energy release to shunt initiation is optimally a function of the energy storage time of the inductor. In the event that this energy storage time is regulated using feedback, the shunt delay should be as well regulated, to accentuate the regulatory action. In a more comprehensive embodiment, the amplifier output polarity is inverted and its output caused to be a function of the positive error in the circumstance of a substantial positive error, such as that caused by an inductive load.

15 Claims, 3 Drawing Sheets

LOAD COMPENSATION TECHNIQUE FOR REACTIVE IMPEDANCE TRANSFORMATION AMPLIFIER OUTPUT STAGE

This application is a 371 of PCT of PCT/US00/13852 filed May 19, 2000 which claims benefit of 60/134,817 filed May 19, 1999 and claims benefit of 60/174,381 filed Jan. 5, 2000.

FIELD OF THE INVENTION

This invention relates generally to switching amplifiers and, in particular, to apparatus and methods for compensating the output stage in amplifiers of this type so as to reduce back-EMF.

BACKGROUND OF THE INVENTION

Amplifiers with reactive impedance transformation output stages, as shown in U.S. Pat. No. 5,610,553 entitled "Switching Amplifier with Impedance Transformation Output Stage," provide high efficiency at high voltage or current levels. The teachings of this patent are incorporated herein by reference.

Unlike conventional amplifiers, however, impedance transformation switching amplifiers do not exhibit symmetrical or constant drive capability. As a result, unless compensated, back-EMF from the load can seriously distort the output waveform. As well, inductance in anti-aliasing output filters commonly used with such switching amplifiers can seriously degrade performance.

A need accordingly exists for a compensation method to counteract asymmetrical and variant output impedance in switching amplifiers of this type.

SUMMARY OF THE INVENTION

This invention provides circuitry for reducing and, preferably eliminating, load-induced back-EMF in impedance-transformation switching amplifiers. Different embodiments are deployed, depending upon the severity of the error. Broadly a gated switch coupled to the load is driven by a control circuit appropriately timed to shunt back-EMF. In the event that the amplifier is already equipped with gated switches used to transfer energy representative of an input signal to and from the load impedance, at least some of the same gated switches may conveniently be used for back-EMF control. In preferred configurations, separate gated switches are used on both sides of the load, and the control circuit is configured to drive all of the switches.

If the error is relatively minor, the control circuit may include a timer operative to activate the gated switch after a fixed time interval. Alternatively, the time interval may be varied in relation to the time associated with energy dissipation through a purely resistive load. If the energy storage time of the load is regulated using feedback, the initiation of the shunting action is also preferably feedback-regulated.

If the error is more severe, an error detection circuit is used to determine if the amplifier output voltage exceeds a level representative of a desired input, and circuitry is added for inverting the polarity of the output if the level is exceeded. In accordance with this alternative method, the amplifier output polarity is inverted and its output caused to be a function of the positive error in the circumstance of a substantial positive error, such as that caused by an inductive load.

DETAILED DESCRIPTION OF THE INVENTION

Figure 1:
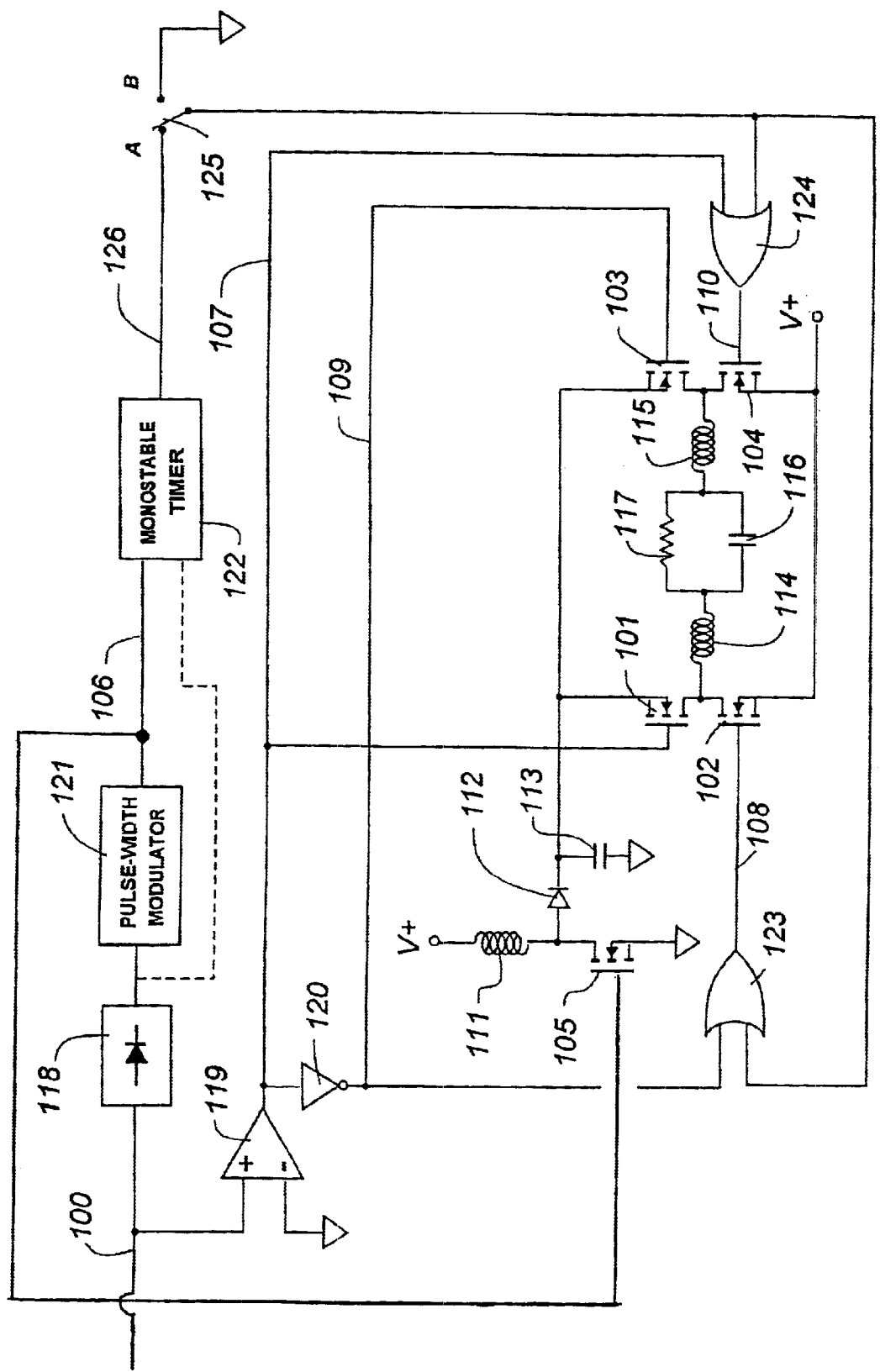
FIG. 1 is a schematic diagram of a reactive impedance transformation amplifier output stage incorporating an embodiment of the invention for compensating a relatively minor error.

FIG. 1 is a schematic diagram of an output stage incorporating an embodiment of the invention used to correct relatively minor errors. Switch 125 is included to show operation with and without the functionality of the invention.

Incoming data 100 is supplied to full-wave rectifier 118 and comparator 119. The absolute value of incoming data 100 is thus supplied to pulse width modulator 121, while its sign is supplied by comparator 119 to switching device 101 and OR gate 124, which drives switching device 104 as voltage 110. The complement of the sign is provided by inverter 120 to switching device 109 and OR gate 123, which drives switching device 102 as voltage 108. The polarity if the incoming data 100 thus controls which pair of switching devices 101 and 104, or 103 and 102, is activated.

The output of pulse-width modulator 121 is supplied as voltage 106 to switching device 105, which stores energy in inductor 111 when activated. When switching device 105 is released, stored energy is stored in capacitor 113 and released ultimately into load 117 through diode 112 and either switching device 101 and inductor 114, or switching device 103 and inductor 115, depending on polarity of incoming data 100. Current return for load 117 is provided by either inductor 115 and switching device 104, or inductor 114 and switching device 102, again depending on polarity of incoming data 100. Capacitor 116, in conjunction with inductors 114 and 115, serves to filter the voltage applied to load 117.

With switch 125 in the 'B' position, operation is typical of this class of amplifier. Energy is stored in inductor 111 when charged by switching device 105 under control of voltage 106 from pulse-width modulator 121. When switching device 105 is turned off, the stored energy is released through diode 112, limited by capacitor 113, and applied to load 117 through either switching device 101 or switching device 103, under control of voltage 107 or voltage 109, respectively, the assertions of which are mutually exclusive. In this manner, the desired output polarity at load 117 is effected.

Inductors 114 and 115, and capacitor 116 serve to remove switching components from the energy supplied to load 117. The return path for the stored energy released from inductor 111 is provided by either switching device 102 or switching device 104, under control of voltage 108 and voltage 110, respectively, the assertions of which are again mutually exclusive.

Figure 2:
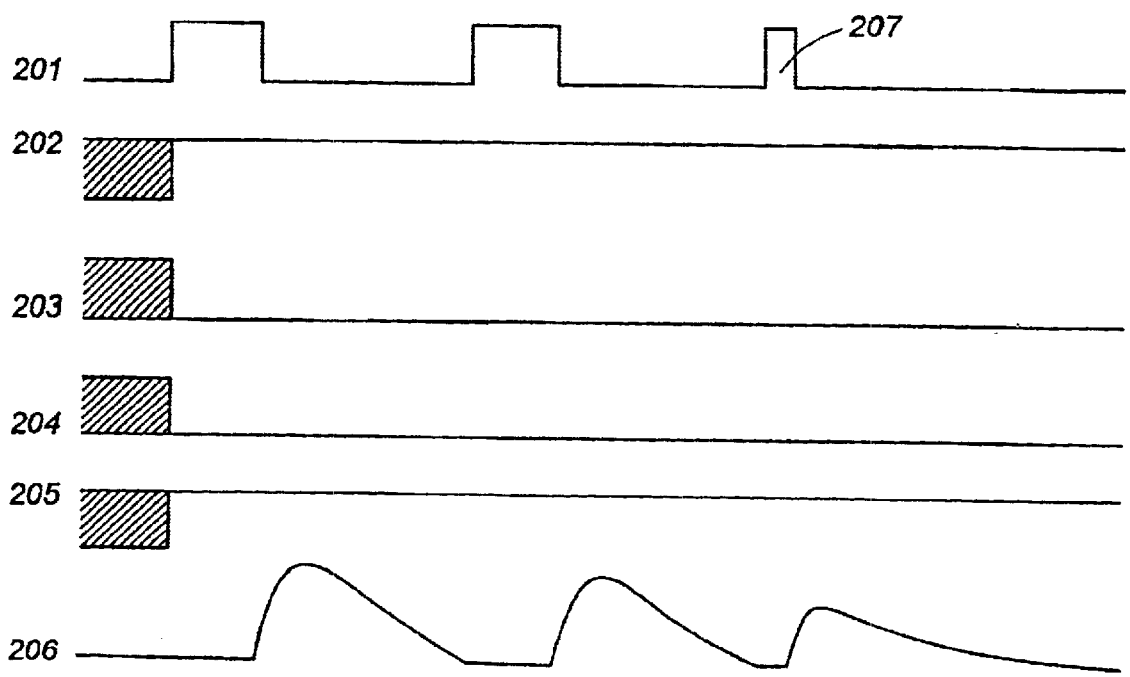
FIG. 2 shows the control and output voltage waveforms of the circuit in FIG. 1, with the invention disabled, thus yielding waveforms typically seen in reactive impedance transformation amplifiers.

The voltage waveforms of FIG. 2 show operation of the circuit of FIG. 1 when switch 125 is in the 'B' position, disabling functionality of the present invention It will be seen that further input to switching devices 102 and 104 by OR gates 123 and 124, respectively, is obviated, and operation is that typical of a reactive impedance transformation amplifier. Control voltages 201, 202, 203, 204, and 205 of FIG. 2 correspond to control voltages 106, 107, 108, 109, and 110, respectively, of FIG. 1. Voltage 206 shows activity at the junction of switching devices 101 and 102 of FIG. 1. It can be seen that, under the condition of diminishing output shown at point 207, the decay slope of voltage 206 is considerably less steep than the previous decay slopes at increasing or constant output. This voltage rise is due to back EMF from the load attempting to maintain the previous electrical and mechanical speaker conditions, and represents a considerable distortion.

When switch 125 is in the 'A' position, OR gates 123 and 124 allow assertion of switching devices 102 and 104, respectively, by the output of monostable timer 122. At the falling edge of voltage 106 (release of switching device 105), monostable timer 122 deasserts its output 126 for either a fixed time interval, or a time interval that is a function of the absolute value of the incoming data (shown by dotted data path). At expiration of this time interval, monostable timer 122 asserts its output, which, when enabled by switch 125, is applied to OR gates 123 and 124. OR gates 123 and 124 pass this assertion to switching devices 102 and 104, respectively.

Note that either switching device 102 or 104 is activated at any given time by the action of comparator 119 and inverter 120, under control of the polarity of incoming data 100, as mentioned previously. At the point of output assertion of monostable timer 122, therefore, both switching devices 102 and 104 are activated, effectively shunting any voltage extant across load 117, through inductors 114 and 115. The timing interval of monostable timer 122 is optimally adjusted to approximate the time necessary for energy depletion in capacitor 113.

Figure 3:
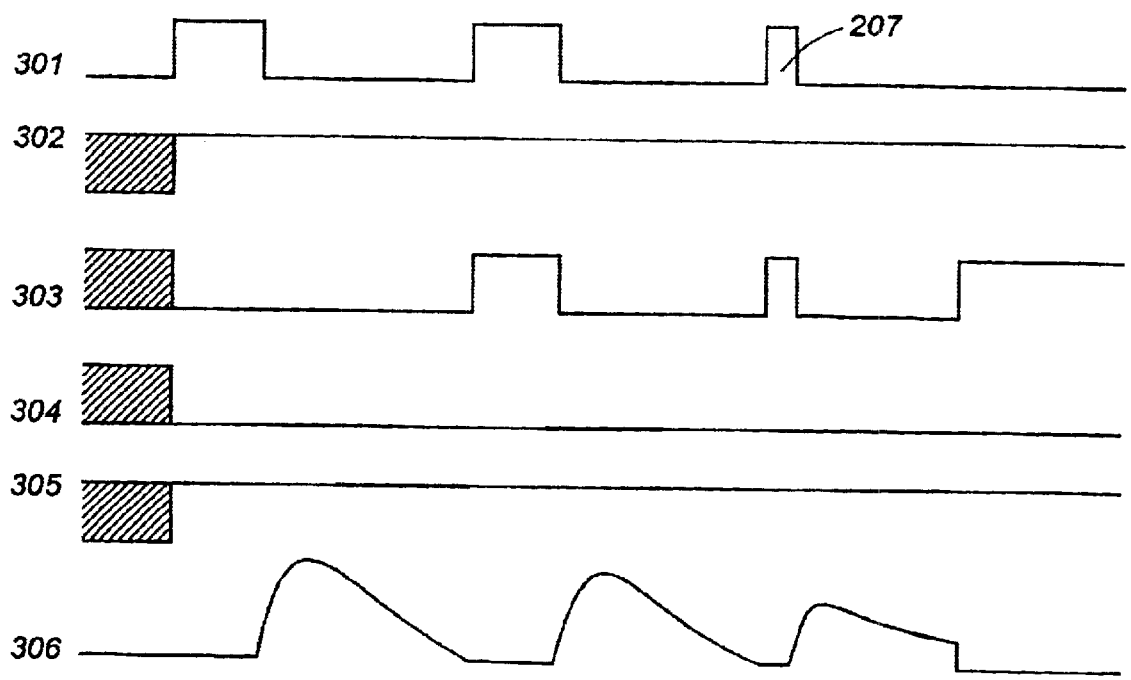
FIG. 3 shows the control and output voltage waveforms of the circuit in FIG. 1, with the invention being enabled.

Voltage waveforms of FIG. 3 show operation of the circuit of FIG. 1 when switch 125 is in the 'A' position, enabling functionality of the present invention Referring now to FIG. 3, control voltages 301, 302, 303, 304, and 305 correspond to control voltages 106, 107, 108, 109, and 110, respectively, of FIG. 1. Voltage 306 shows activity at the junction of switching devices 101 and 102 of FIG. 1. An important difference between the control voltages 301, 302, 303, 304, and 305 of FIG. 3 and control voltages 201, 202, 203, 204, and 205 of FIG. 2 is the assertion of voltage 303 at a point after release of voltage 301 until the next release of voltage 301. In correlating this voltage to the schematic of FIG. 1, it can be seen that the net effect is one of selectively shunting any voltage present at the junction of switching devices 101 and 102 of FIG. 1. Back EMF injected by load 117 is thereby shunted. Although a single polarity is shown, it is assumed that a correlative action is as well asserted at control voltage 110 of FIG. 1.

The ideal time at which to initiate the shunting action described herein is the time at which the released energy from capacitor 113 of FIG. 1 would approach zero with a purely resistive load. In that this delay time can be a function of energy released, the delay from energy release to shunt initiation is optimally a function of the energy storage time of the inductor. In the event that this energy storage time is regulated using feedback the shunt delay should be as well regulated to accentuate the regulatory action.

Figure 4:
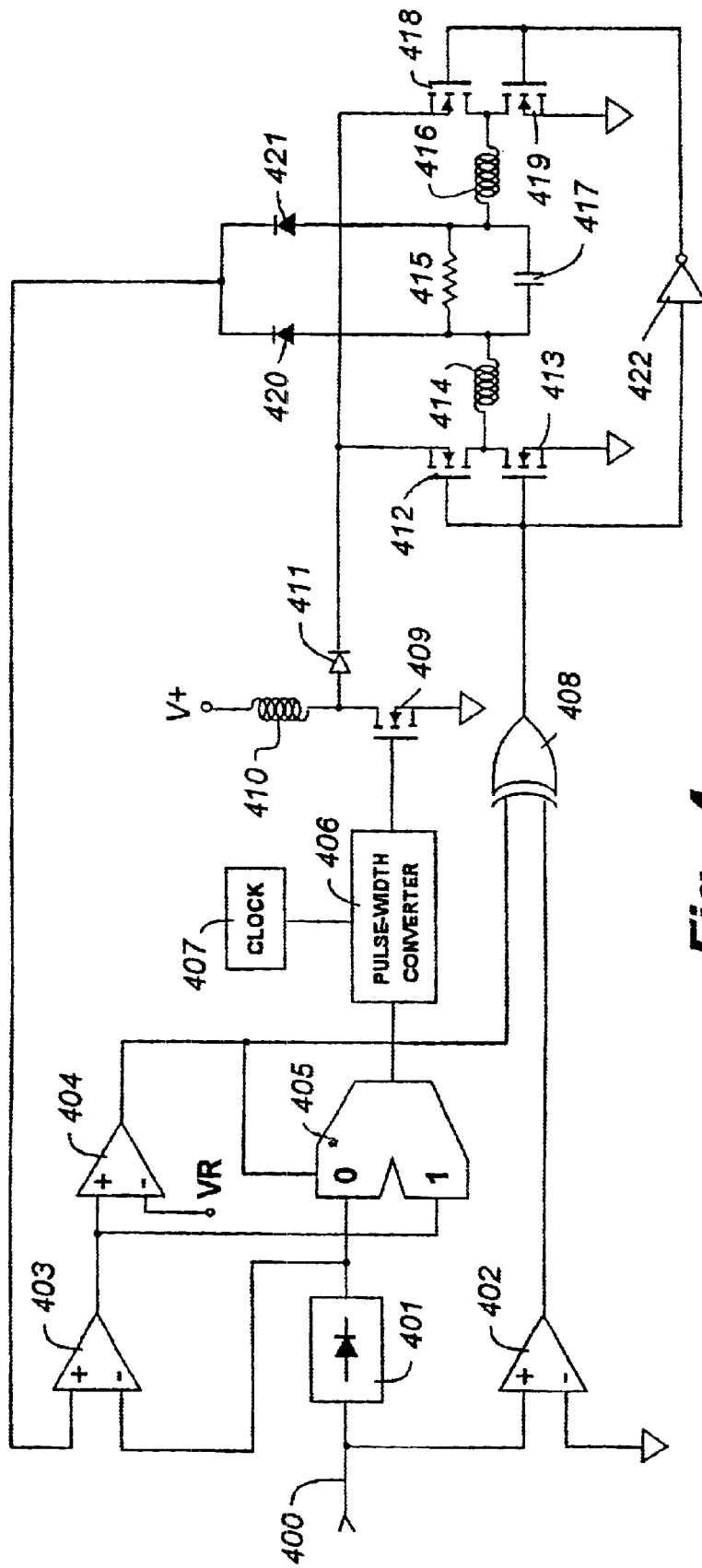
FIG. 4 is a schematic diagram of the invention compensating a relatively major error.

FIG. 4 is a schematic diagram of a preferred circuit according to the invention for correcting relatively large errors. Incoming signal 400 feeds both full-wave rectifier 401 and comparator 402, which indicates desired output polarity at its output. The output of comparator 402 drives one input of exclusive-OR gate 408 which, in turn, either turns on switching devices 415 and 418 through inverter 412 (when high), or activates switching devices 412 and 419 through inverter 412 when low.

The output of full-wave rectifier 401 drives both the '0' input of multiplexer 405 and the inverting input of error amplifier 403, the non-inverting input of which is driven by the common cathodes of diodes 420 and 421. The anodes of diodes 420 and 421 are individually connected each to one terminal of the load 415, thus yielding the absolute positive output voltage of the amplifier at their common cathodes. Thus error amplifier 403 outputs a positive voltage if the amplifier output voltage exceeds that indicated by the desired input, and a negative voltage if the amplifier output voltage is less than that indicated by the desired input.

The output of error amplifier 403 drives both the non-inverting input of comparator 404 and the 'I' input of multiplexer 405. Comparator 404 compares the output of error amplifier 403 with a reference, outputting a logical one when the amplifier output at the load exceeds that indicated by the desired input by a margin indicated by the reference voltage at its inverting input.

The output of comparator 404 drives the control input of multiplexer 405 and the second input of exclusive-OR gate 408. Thus, when the output of comparator 404 is a logical zero, multiplexer 405 supplies the desired input to pulse-width converter 406, and the indicated input polarity to switching devices 412, 413, 418, and 419. However, when the output of comparator 404 is a logical one, multiplexer 405 now supplies the output of error amplifier 403 (positive error) to pulse-width converter 406, and the indicated input polarity to switching devices 412, 413, 418, and 419 is inverted by exclusive-OR gate 408. Pulse-width converter 406 is periodically triggered by clock source 407.

The output of pulse-width converter 406 drives switching device 409, which stores charge in inductor 410. At release, this charge passes through diode 411 and is presented to one terminal of load 415 through either switching device 412 and inductor 414, or switching device 418 and inductor 416, depending on the current output of exclusive-OR gate 408 noted earlier. In either event, the voltage presented to the load is filtered by capacitor 417.

By this method, the amplifier output polarity is inverted and its output caused to be a function of the positive error in the circumstance of a substantial positive error, such as that caused by an inductive load.

I claim:

1. Distortion-control apparatus for use with a supply voltage, comprising:
 a switching amplifier output stage of the type which performs a variable-impedance transformation on a pulsewidth-modulated input signal and couples the output to a reactive load, including circuitry enabling the output to operate at voltage in excess of supply voltage;
 a gated switch coupled to the load impedance; and
 a control circuit driving the gated switch so as to shunt back-EMF (electromotive force).

2. The circuitry of claim 1, including a gated switch coupled to each side of the load, and wherein the control circuit drives both switches.

3. The circuitry of claim 2, wherein a plurality of gated switches are to transfer energy representative of an input signal to and from the load impedance, and wherein at least some of the same gated switches are driven by the control circuit.

4. The circuitry of claim 1, wherein the control circuit is a timer operative to activate the gated switch after a fixed time interval.

5. The circuitry of claim 4, wherein the time interval is related to the time associated with energy dissipation through a purely resistive load.

6. The circuitry of claim 1, wherein:

the output coupled to the load is regulated using feedback; and the initiation of the shunt is also feedback-regulated.

7. The circuitry of claim 1, wherein:

the amplifier is fed by incoming data; and the control circuit is operative to activate the gated switch as a function of the absolute value of the incoming data.

8. The circuitry of claim 1, wherein the control circuit further includes:

an error detection circuit for determining if the amplifier output voltage exceeds a level representative of a desired input; and circuitry for inverting the polarity of the output If the level is exceeded.

9. The circuitry of claim 8, wherein:

the amplifier includes a pulse-width converter for converting incoming data into a pulse-width modulated signal coupled to the load through a plurality of gated switches; and the circuitry for inverting the polarity of the output further includes a multiplexer for supplying the output of error detection circuit to the pulse-width converter.

10. The circuitry of claim 9, wherein at least some of the gated switches used to couple the pulse-width modulated signal to the load arc also driven by the control circuit.

11. The circuitry of claim 1, wherein the input signal to the amplifier is analog or digital.

12. The circuitry of claim 1, wherein the gated switch is a field-effect transistor.

13. Distortion control apparatus for use with a supply voltage, comprising:

a switching amplifier output stage of the type which performs a variable-impedance transformation on a pulsewidth-modulated input signal and couples the output to a reactive load;

including circuitry enabling the output to operate at voltage in excess of supply voltage;

a controlled switch in an electrical path with the load impedance; and circuitry operative to control the switch so as to shunt back-EMF (electromotive force) injected by the load.

14. The switching amplifier output stage of claim 13, wherein:

the output is coupled bidirectionally to the load impedance; and the circuitry is operative to control switches on both side of the load.

15. The switching amplifier output stage of claim 13, wherein:

a plurality of electrically controlled switches are used to couple the pulsewidth-modulated input signal to the load impedance; and at least one of the switches is controlled by the circuitry to shunt back-EMF (electromotive force) injected by the load.

* * * * *

UNITED STATES PATENT AND TRADEMARK OFFICE
CERTIFICATE OF CORRECTION

PATENT NO.    : 6,636,113 B1
DATED         : October 21, 2003
INVENTOR(S)   : Larry Kirn It is certified that error appears in the above-identified patent and that said Letters Patent is hereby corrected as shown below:

Column 1,
Line 8, replace "60/174,381" with -- 60/174,399 --.
Line 14, after "EMF" insert -- (electromotive force) --.

Column 5,
Line 15, replace "If" with -- if --.
Line 27, replace "arc" with -- are --.

Signed and Sealed this

Eighteenth Day of May, 2004

JON W. DUDAS
*Acting Director of the United States Patent and Trademark Office*